United States Patent
Arao et al.

(10) Patent No.: US 7,195,855 B2
(45) Date of Patent: Mar. 27, 2007

(54) NEGATIVE-TYPE PHOTOSENSITIVE RESIN COMPOSITION CONTAINING EPOXY COMPOUND

(75) Inventors: Kei Arao, Niigata (JP); Makoto Nomura, Niigata (JP)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 10/768,940

(22) Filed: Jan. 30, 2004

(65) Prior Publication Data

US 2004/0224253 A1    Nov. 11, 2004

(30) Foreign Application Priority Data

Jan. 30, 2003  (JP) .............................. 2003-022666

(51) Int. Cl.
*G03F 7/004*   (2006.01)
(52) U.S. Cl. ............................... 430/270.1; 430/286.1; 430/280.1
(58) Field of Classification Search ............. 430/270.1, 430/286.1, 280.1
See application file for complete search history.

(56) References Cited

U.S. PATENT DOCUMENTS

| | | | | |
|---|---|---|---|---|
| 4,231,951 | A | * | 11/1980 | Smith et al. ................... 556/80 |
| 5,262,280 | A | * | 11/1993 | Knudsen et al. ............. 430/312 |
| 5,300,380 | A | | 4/1994 | Roth et al. |
| 5,312,715 | A | * | 5/1994 | Daniels et al. ............ 430/280.1 |
| 5,334,671 | A | * | 8/1994 | Yezrielev et al. ............ 525/443 |
| 5,366,846 | A | * | 11/1994 | Knudsen et al. .......... 430/280.1 |
| 5,514,728 | A | * | 5/1996 | Lamanna et al. .............. 522/31 |
| 5,858,618 | A | * | 1/1999 | Tzou ........................... 430/285.1 |
| 5,877,229 | A | * | 3/1999 | Janke et al. .................... 522/31 |
| 6,730,402 | B2 | * | 5/2004 | Kiuchi et al. ................ 428/414 |
| 2003/0152776 | A1 | * | 8/2003 | Kiuchi et al. ................ 428/413 |
| 2004/0219451 | A1 | | 11/2004 | Arao et al. |

FOREIGN PATENT DOCUMENTS

| | | | |
|---|---|---|---|
| EP | 1142923 | * | 10/2001 |
| JP | 55-129341 | | 10/1980 |
| JP | 55129341 | | 10/1980 |
| JP | 56-150741 | | 11/1981 |
| JP | 60-026943 | | 7/1983 |
| JP | 60026943 | | 2/1985 |
| JP | 1993-273753 | | 10/1993 |
| JP | 1993-273753 | A | 10/1993 |
| JP | 1994-102662 | | 4/1994 |
| JP | 1994-102662 | A | 4/1994 |
| JP | 7-140648 | | 6/1995 |
| JP | 1997-087362 | | 3/1997 |
| JP | 1997-087362 | A | 3/1997 |
| JP | 1997-132623 | | 5/1997 |
| JP | 1997-134623 | A | 5/1997 |
| JP | 9-309944 | | 12/1997 |

OTHER PUBLICATIONS

Edward D. Weil, et al, "A Review of Current Flame Retardant Systems for Epoxy Resins", Journal of Fire Sciences, vol. 22, Jan. 2004, pp. 25-40.
Masatoshi Iji, et al, "Flame retardant epoxy resin compounds containing novolac derivaties with aromatic compounds", Polymers for Advanced Technologies, vol. 12, 2001, pp. 393-406.
Kiuchi et al., "Development of Environmentally Safe Flame-Retarding Epoxy Resin Compounds without Halogen and Phosphorus Derivatives and Their Application to Printed Wiring Boards", NEC Res. & Development, vol. 44, No. 3, Jul. 2003, pp. 256-262.
Licari, JJ., Coating Materials for Electronic Applications-Polymers, Processes, Reliability, Testing, Publisher: William Andrew Publishing/Noyes, 2003 ISBN 0-8155-1492-1 released on Knovel database Jun. 3, 2003.

* cited by examiner

*Primary Examiner*—Amanda Walke
(74) *Attorney, Agent, or Firm*—Jonathan D. Baskin

(57) ABSTRACT

A negative-type photosensitive resin compositions containing an epoxy compound are provided. These compositions use poly(p-vinylphenol) as the base resin and have good development performance when using an aqueous developer, such as tetramethylammonium hydroxide solution.

10 Claims, No Drawings

NEGATIVE-TYPE PHOTOSENSITIVE RESIN COMPOSITION CONTAINING EPOXY COMPOUND

BACKGROUND OF THE INVENTION

This invention relates generally to the field of negative-type photosensitive resin compositions. In particular, this invention relates to photosensitive resin compositions containing an epoxy compound and to a method for the formation of a resist pattern using resin composition.

Currently, an epoxy resin composition containing epoxy resin and phenol resin is commonly used as a sealing material for semiconductor devices, such as IC, LSI, due to the high reliability of the material.

In order to achieve better physical properties, recently, a photosensitive resin composition containing phenol resin as well as an epoxy compound has been proposed as a photoresist in the manufacturing process of wafer-level-chip-size package (WL-CSP). However, this type of photosensitive resin composition has a low solubility in the developing agents commonly used in the industry, such as an aqueous solution of tetramethylammonium hydroxide (abbreviated herein as TMAH), causing difficulties in the developing step. Therefore, it is highly desirable to develop a new photosensitive resin material, which is able to retain the excellent physical properties of the epoxy resin, such as high-temperature impact resistance, but without having the problem mentioned above.

SUMMARY OF THE INVENTION

The inventors carried out of studies on various aqueous alkaline solutions suitable as a developing agent for the photosensitive resin compositions containing an epoxy compound. As a result, it was found that the photosensitive resin composition containing an epoxy compound and poly(p-vinylphenol) can be developed with an aqueous alkaline solution, including aqueous TMAH solution. In addition, the inventors also found that the developing properties of the resin composition can be significantly improved when the photosensitive resin composition further contains a phenol-biphenylene resin.

This invention provides a negative-type photosensitive resin composition, which contains an epoxy compound and, as a base resin, poly(p-vinylphenol) and can be developed with an aqueous alkaline solution, including aqueous TMAH solution. This invention is a negative-type photosensitive resin composition, which contains an epoxy compound and, as a base resin, poly(p-vinylphenol) as well as a phenol-biphenylene resin and can be developed with an aqueous alkaline solution including aqueous TMAH solution, under the conditions currently used for the formation of a photoresist.

This invention concerns a negative-type photosensitive resin composition containing an epoxy compound and poly (p-vinylphenol). In another embodiment, this invention concerns a negative-type photosensitive resin composition containing an epoxy compound and poly(p-vinylphenol) as well as a phenol-biphenylene resin.

In a further embodiment, this invention concerns a method for the formation of a resist pattern, including the steps of coating the negative-type photosensitive resin composition described above on a substrate, exposing and developing of the negative-type photosensitive resin composition film formed on the substrate to form the resist pattern.

DETAILED DESCRIPTION OF THE INVENTION

The negative-type photosensitive resin composition of this invention contains an epoxy compound. The epoxy compound is an organic compound carrying one or more oxirane rings capable of ring-opening polymerization. The compound is widely known as an epoxide, including aliphatic, alicyclic aromatic, and heterocyclic epoxide present as a monomer, oligomer, or polymer. Preferably, the compound is an epoxide carrying 2 or more polymerizable epoxy groups per molecule. A polymeric epoxide can be, for example, a linear polymer carrying terminal epoxy groups, such as polyoxyalkylene glycol diglycidyl ether, a polymer containing an oxirane unit in the main polymer chain, such as polybutadiene polyepoxide, or a polymer containing an epoxy group in the side chain of the polymer, such as a polymer or oligomer of diglycidyl methacrylate. The epoxide can be either a pure compound or a mixture containing one or two or more epoxy groups per molecule.

The epoxy compound can be, for example, a low molecular weight monomer, an oligomer, or a high molecular weight polymer, which may have various main chains and carry various substituent groups. For example, the main chain can be any type of polymer chain, while the substituent group can be a group capable of being joined to an oxirane unit. Examples of such substituent groups include, without limitation, halogen atom, ester group, ether group, sulfonate group, siloxane group, nitro group, and phosphate group.

In one embodiment, the epoxy compound of this invention is a glycidyl ether, including a polyvalent phenol glycidyl ether. Such polyvalent phenol glycidyl ether can be prepared through the reaction of a polyvalent phenol with excess chlorohydrin or epichlorohydrin, such as diglycidyl ether of 2,2-bis(2,3-epoxy-propoxyphenol)-propane. In another embodiment, the epoxy compound of this invention is a bisphenol A type epoxy compound. Such bisphenol A type epoxy compound can be prepared by reaction of bisphenol A with epichlorohydrin. In a still further embodiment, the epoxy compound of this invention is the compound represented by the following general formula (I):

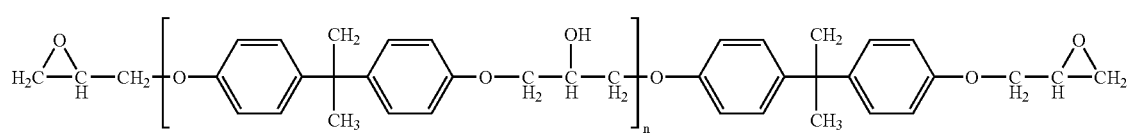

(I)

wherein, n=0–2, preferably n=0–1, more preferably n=0.

Other examples of the epoxy compound are those described in U.S. Pat. No. 3,018,262. In general, the epoxy compounds used in this invention are commercially available. For example, commercially available epoxides include, without limitation, epichlorohydrin, glycidol, glycidyl methacrylate, p-tert-butylphenol glycidyl ether, such as Epi-Rez 5014 (Celanese Co.), bisphenol A diglycidyl ethers, such as Epon 828, Epon 1004, Epon 1010 (Shell Chemical Co.), and DER-331, DER-332, DER-334 (Dow Chemical Co.), vinylcyclohexene dioxide, such as ERL-4206 (Union Carbide Corp.), 3,4-epoxy-6-methyl-cyclohexylmethyl 3,4-epoxy-6-methylcyclohexenecarboxylate, such as ERL-4201 (Union Carbide Corp.), bis(3,4-epoxy-6-methyl-cyclohexylmethyl) adipate, such as ERL-4289 (Union Carbide Corp.), bis(2,3-epoxycyclopentyl) ether, such as ERL-0400 (Union Carbide Corp.), polypropylene-glycol-modified aliphatic epoxide, such as ERL-4050 and ERL-4269 (Union Carbide Corp.), dipentene dioxide, such as ERL-4269 (Union Carbide Corp.), brominated bisphenol type epoxy resin, such as DER-580 (Dow Chemical Co.), 1,4-butanediol diglycidyl ether/phenol formaldehyde novolac, such as DEN-431 and DEN-438 (Dow Chemical Co.), and resorcinol diglycidyl ether, such as Kopoxite (Koppers Company, Inc.).

The negative-type photosensitive resin composition of this invention contains poly(p-vinyl-phenol). The poly(p-vinylphenol) used in this invention is a polymer including p-vinylphenol as polymerized units. There is no special limitation on the polymer as long as it contains no epoxy group. Typically, the polymer contains 50 weight % or more p-vinylphenol as polymerized units. More typically, the polymer contains 75 weight % or more p-vinylphenol as polymerized units. In another embodiment, the polymer contains 90 weight % or more p-vinylphenol as polymerized units. In a further embodiment, the polymer contains only p-vinylphenol as polymerized units and is a homopolymer of p-vinylphenol. The weight-average molecular weight of the poly(p-vinylphenol) is typically in the range of 2000–40,000, and more typically from 5000–35,000.

The poly(p-vinylphenol), polymers of this invention may contain as polymerized units compounds other than p-vinylphenol. Any compound copolymerizable with p-vinylphenol may be used, as long as the use of the compound will not affect the purpose of this invention. Examples of the copolymerizable compound include, without limitation, esters of acrylic acid or methacrylic acid, such as methyl acrylate, methyl methacrylate, hydroxyethyl acrylate, butyl methacrylate, octyl acrylate, 2-ethoxyethyl methacrylate, t-butyl acrylate, 1,5-pentanediol diacrylate, N,N-diethylaminoethyl acrylate, ethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, 2,2-di(p-hydroxyphenyl)propane dimethacrylate, triethylene glycol diacrylate, polyoxyethyl-2,2-di(p-hydroxyphenyl)propane dimethacrylate, triethylene glycol dimethacrylate, polyoxypropyl trimethylolpropane triacrylate, ethylene glycol dimethacrylate, butylene glycol dimethacrylate, 1,3-propanediol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenylethylene 1,2-dimethacrylate, pentaerythritol tetramethacrylate, trimethylolpropane trimethacrylate, 1,5-pentanediol dimethacrylate, 1,4-benzenediol dimethacrylate, styrene derivatives, such as styrene, 2-methylstyrene, vinyltoluene, vinyl esters, such as vinyl acrylate, vinyl methacrylate, vinylphenols, such as o-vinylphenol, and m-vinylphenol, etc. However, these examples should not be considered as limitations of this invention.

The poly(p-vinylphenol) can be prepared by known methods. Commercially available products, such as Marcalinker M S4P (Maruzen Sekiyu Co.), may also be used.

In one embodiment, the negative-type photosensitive resin composition of this invention also contains a phenol-biphenylene resin. Such phenol-biphenylene resin is a polymer including phenol and biphenylene as polymerized units. In addition to the phenol and biphenylene repeating units, the polymer may also include an alkylene repeating unit, such as, but not limited to, methylene and ethylene. The phenol and biphenylene repeating units may also carry a substituent group, such as, but not limited to, alkyl group, alkoxy group, as long as the substituent group will not affect the purpose of this invention. The phenol-biphenylene resin carries no epoxy group. The phenol-biphenylene resin can be prepared by any known method. Commercially available products, such as Phenol Resin MEH-7851 (Meiwa Kasei Co.), may also be used. The number-average molecular weight of the phenol-biphenylene resin is typically in the range of 350–1200, and more typically from 370–1000.

Exemplary of such phenol-biphenylene resins is a polymer including of the repeating unit represented by following general formula (II):

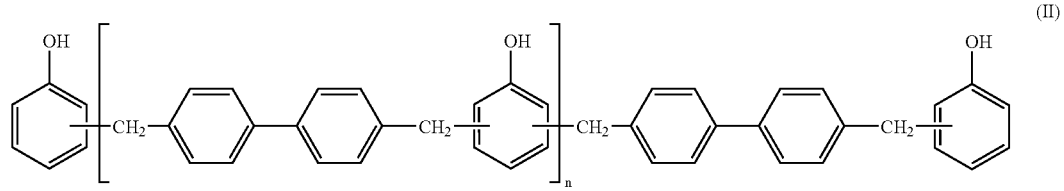

wherein, n=0–4, preferably n=0–3, and more preferably n=0–1.

When the negative-type photosensitive resin composition of this invention contains a phenol-biphenylene resin, the content of the phenol-biphenylene resin is typically in the range of 5–45 weight %, and more typically 10–40 weight %, calculated based on the total weight of poly(p-vinylphenol) and phenol-biphenylene resin.

In addition to the poly(p-vinylphenol) and phenol-biphenylene resin, the negative-type photosensitive resin composition of this invention may also contain other resin binders which do not carry an epoxy group.

The resin binder can be a compound capable of having a photo-crosslinking reaction with one or more components of the negative-type photosensitive resin composition of this invention. Examples of the resin binder include, but are not limited to, compounds carrying a reactive hydrogen atom in one or more parts of the molecule, such as phenol/aldehyde condensation polymer known as novolac resin, alkenylphenol homopolymer or copolymer, partially hydrogenated novolac resin, and N-hydroxyphenylmaleimide homopolymer or copolymer. However, these examples should not be considered as limitations of this invention.

In the negative-type photosensitive resin composition of this invention, the content of the other resin binder is typically in the range of 50 weight % or lower, more typically 25 weight % or lower, calculated based on the total weight of poly(p-vinylphenol), phenol-biphenylene resin and the other resin binder. Preferably, the negative-type photosensitive resin composition of this invention does not contain the other resin binder.

When the other resin binder is a novolac resin, which contains no phenol-biphenylene resin, the content of the novolac resin in the negative-type photosensitive resin composition of this invention is generally in the range of less than 10 weight %, more generally less than 5 weight %, calculated based on the total weight of the epoxy compound, poly(p-vinylphenol), phenol-biphenylene resin and the other resin binder. In one embodiment, the negative-type photosensitive resin composition of this invention does not contain the novolac resin.

In the negative-type photosensitive resin composition of this invention, the weight ratio of the epoxy compound to the total weight of poly(p-vinylphenol), phenol-biphenylene resin and/or the other resin binder or [weight of epoxy compound]/[total weight of poly(p-vinylphenol), phenol-biphenylene resin and/or the other resin binder] is typically in the range of 0.5:1–2:1, and more typically 0.7:1–1.6:1.

The negative-type photosensitive resin composition of this invention contains a photo-acid-generating agent capable of generating an acid under irradiation by an active radiation beam. Any commonly used photo-acid-generating agent is suitable for this purpose. In one embodiment, the photo-acid-generating agent is an onium salt. Preferably, the photo-acid-generating agent is an onium salt carrying a weak nucleophilic cation. The cation can be a divalent to heptavalent metallic element or nonmetallic element, such as Sb, Sn, Fe, Bi, Al, Ga, In, Ti, Zr, Sc, D, Cr, Hf, and Cu as well as a halogen complex of B, P, and As. Examples of the onium salt include, but are not limited to, diaryl diazonium salts, onium salts of group Va, group Vb, group Ia, group Ib, and group I elements, such as halonium salts, including aromatic iodonium salts and iodoxonium salts, quaternary ammonium, phosphonium, and arsonium salts, aromatic sulfonium salts, sulfoxonium salts, and selenonium salts. The photo-acid-generating agent or the onium salt can be prepared by any known method. Commercially available products, such as triallylsulfonium hexafluorophosphate, may also be used. When the photo-acid-generating agent is an iodonium salt, it is preferable to use a salt formed by aryliodoso tosylate and aryl ketone. Such salt may be prepared by the method described in U.S. Pat. No. 4,683,317.

The photo-acid-generating agent may also be a nonionic organic compound. Preferably, the nonionic organic compound is a halogenated nonionic organic compound, such as 1,1-bis(p-chlorophenyl)-2,2,2-trichloroethane (DDT), 1,1-bisp-methoxyphenyl)-2,2,2-trichloroethane) (trade name: Methoxychlor), 1,2,5,6,9,10-hexabromocylcododecane, 1,10-dibromodecane, 1,1-bis(p-chlorophenyl)-2,2-dichloroethane, 4,4'-dichloro-2-(trichloromethyl)benzhydrol, 1,1-bis(chlorophenyl)-2,2,2-trichloroethanol (trade name: Kelthane), hexachlorodimethylsulfone, 2-chloro-6-(trichloromethyl)pyridine, O,O-diethyl-O-(3,5,6-trichloro-2-pyridyl)phosphorothioate (trade name: Dursban), 1,2,3,4,5,6-hexachlorocyclohexane, N-1,1-bis(p-chlorophenyl)-2,2,2-trichloroethylacetamide, tirs(2,3-dibromopropyl) isocyanurate, 2,2-bis(p-chlorophenyl)-1,1-dichloroethylene, as well as the isomers, and analogs of these compounds. However, tris(2,3-dibromopropyl) isocyanurate is preferred. Photo-acid-generating agents suitable for the purpose of this invention are also described in European patent No. 0232972.

The negative-type photosensitive resin composition of this invention should contain a suitable amount of the photo-acid-generating agent sufficient for the development of the coating film formed by the resin composition after exposure under the active radiation beam or after exposure and post-exposure baking treatment.

In addition to the components described above, the negative-type photosensitive resin composition of this invention may also contain a suitable amount of a crosslinking agent, if desired. Any commonly used crosslinking agent is suitable for this purpose. Examples of the crosslinking agent include, without limitation, amine-based compounds, such as monomers, oligomers, polymers of melamine, various resin materials such as formaldehyde resins including melamine-formaldehyde resin, benzoguanamine-formaldehyde resin, urea-formaldehyde resin, and glycoluril-formaldehyde resin, as well as a combination of these agents. Amine-based crosslinking agent, such as Cymel 300, 301, 303, 350, 370, 380, 1116, and 1130 (trade name for melamine resin manufactured by American Cyanamid Company, Wayne, N.J.), Cymel 1123 and 1125 (trade name for benzoguanamine resin), Cymel 1170, 1171, and 1172 (trade name for glycoluril resin), and Beetle 60, 65, and 80 (trade name for urea resin) are preferred. Other similar amine-based compounds are also commercially available from different venders.

Among the amine-based crosslinking agents described above, a melamine resin is particularly suitable, and a melamine-formaldehyde resin is still more suitable. Melamine-formaldehyde resin, which is a reaction product of melamine and formaldehyde. The resin material is usually an ether, such as trialkylolmelamine or hexaalkylolmelamine. The alkyl group may contain 1–8 or more carbon atoms. However, the methyl group is typical. Depending on the reaction conditions and the concentration of formaldehyde used, the methyl ether molecules may react with each other to form complicated units.

The negative-type photosensitive resin composition of this invention may contain a photosensitizer. The photosensitizer is added at a sufficient quantity to increase the sensitivity at a desirable wavelength range. Exemplary photosensitizers include, without limitation, 2-ethyl-9,10-dimethoxyanthracene, 9,10-dichloroanthracene, 9,10-phenylanthracene, 1-chloroanthracene, 2-methylanthracene, 9-methylanthracene, 2-t-butylanthracene, anthracene, 1,2-benzoanthracene, 1,2,3,4-dibenzoanthracene, 1,2,5,6-dibenzoanthracene, 1,2,7,8-dibenzoanthracene, and 9,10-dimethoxydimethylanthracene. However, it is preferable to use 2-ethyl-9,10-dimethoxyanthracene, N-methylphenothiazine, and isopropylthioxanthone.

The negative-type photosensitive resin composition of this invention may also contain other additives, including, but not limited to, dye, filler, wetting agent, flame retardant, leveling agent, and silane coupling agent. When the resin composition of this invention is used on a silicon substrate, silane coupling agent is typically used to improve the affinity to the silicon substrate.

The concentrations of the additives used in the negative-type photosensitive resin composition of this invention should be easily determined by one skilled in the art considering such factors as the nature of the additive, the application of the resin composition, and the type of the substrate. There is no special limitation on the concentrations of the additives.

The negative-type photosensitive resin composition of this invention may also contain a suitable solvent capable of dissolving the components described above. There is no special limitation on the solvent, as long as the solvent is able to dissolve the components present in the negative-type photosensitive resin composition of this invention, and any common solvent can be used for this purpose. The solvent can be, for example, one or more glycol ethers selected from ethylene glycol monomethyl ether, propylene glycol monomethyl ether, dipropylene glycol monomethyl ether, an ester, such as methylcellosolve acetate, ethylcellosolve acetate, 1-methoxy-2-propyl acetate, propylene glycol monomethyl ether acetate, dipropylene glycol monomethyl ether acetate, propylene carbonate, γ-butyrolactone, an alcohol, such as n-propanol, and mixtures thereof. However, the solvents listed here are just examples and should not be considered as limitations of this invention.

The negative-type photosensitive resin composition of this invention can be prepared by dissolving the components described above in the solvent. The concentrations of these components should be easily determined by one skilled in the art, considering such factors as the nature of the component, the application of the resin composition, and the type of the substrate. Usually, the total concentration of the solid components in the negative-type photosensitive resin composition of this invention is in the range of about 10–70 weight % or higher with respect to the total weight. When the resin composition is used for flow coating, the total concentration of the solid components is typically in the range of about 40–50 weight % or higher.

In an embodiment of this invention, the negative-type photosensitive resin composition of this invention is used to form a resist pattern. A film of the negative-type photosensitive resin composition of this invention is coated on a substrate. Then, the coating film is exposed and developed to form a resist pattern.

The present compositions of this invention can be coated on a substrate by any common method, such as screen printing, flow coating, roller coating, slot coating, spin coating, static spraying, spray coating, and dip coating, as well as by dry film lamination. However, these methods should not be considered as limitations of this invention. The viscosity of the present compositions can be adjusted to a suitable range by adding a solvent to decrease the viscosity or by adding a thickener or filler to increase the viscosity. The thickness of the coating film formed on the substrate by the present compositions can be adjusted according to needs. There is no special limitation on the thickness of the coating film.

There is no special limitation on the substrate used in this invention, as along as the substrate is suitable for the formation of a resist pattern. The substrate may have any shape and can be made of any material. Exemplary materials for the substrate include, but are not limited to, resin, ceramic, metal, etc. The resin substrate can be, for example, printed circuit board, semiconductor package, etc. The ceramic substrate can be, for example semiconductor package. The metal substrate can be, for example, copper film. The glass substrate can be, for example, display device, such as LCD and FPD. The substrate can be made of a combination of insulating material and conducting material, for example, a conducting metal pattern formed on a resin plate, or a combination of different conducting materials, for example, a copper sputtering film coated on a silicon wafer.

After having been coated on the substrate, the present composition is dried by removing the solvent to form a coating film. If necessary, a soft bake treatment can be carried out by heating to evaporate the solvent present composition. A suitable heating temperature and time should be used in the soft bake treatment.

In the exposure step, the coating film formed by the present composition is irradiated with an actinic radiation beam. There is no special limitation for the radiation source used for exposure. A light beam at 436 nm, 405 nm, 365 nm, and 254 nm from a mercury lamp or at 157 nm, 193 nm, 222 nm, and 248 nm from an excimer laser is suitable for this purpose. The light beam can be either a monochromatic light or a polychromatic light. Moreover, the phase shift method may also be used in the exposure step. When the present coating composition film is irradiated under a patterned actinic radiation beam, the pattern is transferred onto the composition film.

Next, a post exposure bake (PEB) treatment may be carried out by any common method under suitable conditions. For example, the PEB treatment can be carried out using a hot plate at 70–140° C. for 15 seconds–10 minutes. Instead of a hot plate, a convection oven may also be used. In this case, the treatment time may be longer than the treatment time when using a hot plate.

In the development step, the negative-type photosensitive resin coating composition film coated on the substrate is contacted with a developing solution. The developing solution can be any commonly used developing solution with a suitable concentration. However, it is preferable to use an alkaline developing solution. Examples of the alkaline developing solution include, without limitation, aqueous solutions of an inorganic base, such as potassium hydroxide, sodium hydroxide, sodium carbonate, potassium carbonate, sodium silicate, sodium metasilicate, ammonia, a primary amine, such as ethylamine, n-propylamine, a secondary amine, such as diethylamine, di-n-propylamine, a tertiary amine, such as triethylamine, trimethylamine, and a quaternary ammonium salt, such as tetramethylammonium hydroxide (TMAH), trimethylhydroxyethyl-ammonium hydroxide. It is preferable to use an aqueous solution of TMAH at a concentration of 1–10 weight %, are more preferably 2–5 weight %. The negative-type photosensitive resin composition of this invention has the advantage that it can be developed with aqueous TMAH solution, a common developing solution for photoresist. If necessary, the developing solution may also contain alcohol, surfactant, and the like. Moreover, in order to remove the dust present, the developing solution may be filtered through a filter.

The negative-type photosensitive resin composition of this invention can be used not only in the preparation of WL-CSP and ultra LSI, but also in the manufacturing of ICs. The resin composition of this invention can also be used in the preparation of mask, printing plate, photoresist for printed circuit board, solder resist, and color filter for liquid crystal display, and in the formation of relief image, and used directly in photo-hardening ink, paint, and adhesive. Particularly, the negative-type photosensitive resin composition of this invention is very useful in the preparation of WL-CSP and semiconductor circuits.

In the following, this invention is explained in more detail with practical examples. However, these examples should not be considered as limitations of this invention.

EXAMPLES

In the examples and comparative examples, the resin pattern is formed through following steps 1–5.

Step 1: The negative-type photosensitive resin composition of this invention prepared in the examples and comparative examples is coated using a spin coater on a silicon wafer to form a coating film with a thickness of 11 μm after drying.

Step 2: The substrate coated with the negative-type photosensitive resin composition of this invention is heated in a convection oven at 90° C. for 30 minutes.

Step 3: The substrate is covered with a quartz mask printed with a chromium pattern and irradiated with UV light generated a high pressure mercury lamp (lines i, g, and h) at a total exposure of 1000 mJ at i-line.

Step 4: The exposed substrate was heated in a convection oven at 70° C. for 30 minutes for post-exposure baking.

Step 5: The development is carried out by dipping the substrate in a 2.38 weight % aqueous TMAH solution at 23° C. for 2.5 minutes. The formation of the resin pattern is confirmed by visual inspection.

Examples 1–6

In Examples 1–6, the negative-type photosensitive resin composition was prepared according to the composition listed in Table 1. The resin pattern was formed through steps 1–5 described above. The results obtained are shown in Table 1.

Examples 1–9

In Comparative Examples 1–9, the negative-type photosensitive resin composition was prepared according to the compositions listed in Table 2. The resin pattern was formed through steps 1–5 described above. The results obtained are shown in Table 2.

In Tables 1 and 2, the symbols used in the item of "TMAH development performance" have the following meanings.

"O"=The photosensitive resin composition film was completely developed.

"Δ"=Only the surface layer of the photosensitive resin composition film was developed and residual film was observed.

"X"=The photosensitive resin composition film was not developed.

The components listed in the tables are as follows:

Poly(p-vinylphenol) (Marcalinker M S4P, Maruzen Sekiyu Co.);

Novolac resin 1 (weight-average molecular weight 30000);

Novolac resin 2 (weight-average molecular weight 4000);

Phenol-biphenylene resin (softening point: 79° C., OH eq: 207 g/eq) (Phenol Resin MEH-7851M, Meiwa Kasei Co.);

Epoxy resin: Bisphenol A type epoxy resin (Epikote 828, Japan Epoxy Resin Co., Ltd.);

Crosslinking agent: Hexamethoxymethylated melamine (Mitsui Saitech Co., Ltd.);

Photo-acid-generating agent: Triallylsulfonium hexafluorophosphate;

Photosensitizer: 2-Ethyl-9,10-dimethoxyanthracene;

Silane coupling agent: γ-glycidoxypropyltrimethylsilane (Torei-Dow Chemical Silane Co., Ltd.); and PMA: 1-Methoxy-2-propyl acetate

TABLE 1

| Component | Example 1 | Example 2 | Example 3 | Example 4 | Example 5 | Example 6 |
| --- | --- | --- | --- | --- | --- | --- |
| Poly(p-vinylphenol) (g) | 24 | 21 | 18 | 15 | 12 | 6 |
| Phenol-biphenylene resin (g) | — | 3 | 6 | 9 | 12 | 18 |
| Epoxy resin (g) | 27 | 26 | 25 | 23 | 22 | 19 |
| Crosslinking agent (g) | 4 | 4 | 4 | 4 | 3 | 3 |
| Photo-acid-generating agent | 4 | 4 | 4 | 4 | 4 | 4 |
| Photosensitizer (g) | 0.4 | 0.4 | 0.4 | 0.4 | 0.4 | 0.4 |
| Silane coupling agent (g) | 1 | 1 | 1 | 1 | 1 | 1 |
| PMA) (g) | 39 | 39 | 39 | 39 | 39 | 39 |
| TMAH development performance | Δ | O | O | O | Δ | Δ |

TABLE 2

| Component | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 |
| --- | --- | --- | --- | --- | --- | --- | --- | --- | --- |
| Novolac resin 1 (weight-average molecular weight 30000) (g) | 24 | 18 | 12 | 6 | — | — | — | — | — |
| Novolac resin 2 (weight-average molecular weight 4000) (g) | — | — | — | — | — | 24 | 18 | 12 | 6 |
| Phenol-biphenylene resin (g) | — | 6 | 12 | 18 | 24 | — | 6 | 12 | 18 |
| Epoxy resin (g) | 27 | 25 | 22 | 19 | 16 | 27 | 25 | 22 | 19 |
| Crosslinking agent (g) | 4 | 4 | 3 | 3 | 2 | 4 | 4 | 3 | 3 |
| Photo-acid-generating agent (g) | 4 | 4 | 4 | 4 | 4 | 4 | 4 | 4 | 4 |

TABLE 2-continued

| Component | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 |
| --- | --- | --- | --- | --- | --- | --- | --- | --- | --- |
| Photosensitizer (g) | 0.4 | 0.4 | 0.4 | 0.4 | 0.4 | 0.4 | 0.4 | 0.4 | 0.4 |
| Silane coupling agent (g) | 1 | 1 | 1 | 1 | 1 | 1 | 1 | 1 | 1 |
| PMA (g) | 39 | 39 | 39 | 39 | 39 | 39 | 39 | 39 | 39 |
| TMAH development performance | X | X | X | X | X | X | X | Δ | Δ |

In Comparative Examples 1 and 6, when the resin composition contained novolac resin 1 or 2, but not phenol-biphenylene resin, it was impossible to develop the resin film by using the aqueous TMAH solution. In Example 1, however, the surface layer was developed, when the resin composition contained poly(p-vinylphenol). Therefore, when using an aqueous TMAH solution or other agents with the same performance as the aqueous TMAH solution as the developing agent, the poly(p-vinylphenol) is a better base resin for a negative-type photosensitive resin composition containing an epoxy compound.

Further, only the surface layer was developed in Example 1, when the resin composition contained no phenol-biphenylene resin. The results obtained in Comparative Example 5 indicate that when the resin composition contained phenol-biphenylene resin, but not poly(p-vinylphenol), the resin film could not be developed using the aqueous TMAH solution. As shown in Comparative Examples 8 and 9, when the resin composition contains both phenol-biphenylene resin and novolac resin, only the surface layer of the resin film was developed when the amount of the novolac resin was reduced and the molecular weight of the novolac resin was decreased. In other cases (Comparative Examples 2–4 and 7), the resin film was not developed at all.

However, when the resin composition contains poly(p-vinylphenol) and phenol-biphenylene resin, as shown in Examples 2–4, complete development of the resin film was achieved. These results suggest that the negative-type photosensitive resin composition containing an epoxy compound can be developed by using an aqueous TMAH solution when the resin composition contains poly(p-vinylphenol) and phenol-biphenylene resin. Particularly, as shown in Examples 5 and 6, better TMAH development performance can be achieved, when the content of phenol-biphenylene resin in the resin composition is lower than that of poly(p-vinylphenol).

As described above, the negative-type photosensitive resin composition containing an epoxy compound of this invention uses poly(p-vinylphenol) as the base resin and has good TMAH development performance compared to the current resin composition using novolac resin as the base resin. The TMAH development performance of the negative-type photosensitive resin composition containing an epoxy compound can be further improved, when the resin composition uses a combination of poly(p-vinylphenol) and phenol-biphenylene resin as the base resin.

What is claims is:

1. A negative-type photosensitive resin composition comprising an epoxy compound, poly(p-vinylphenol) and a phenol-biphenylene resin.

2. The negative-type photosensitive resin composition Of claim 1, wherein the phenol -biphenylene resin is present in the range of 5–45 weight % based on the total weight of poly(p-vinylphenol) and phenol-biphenylene resin.

3. Method for the formation of a resist pattern, comprising the steps of coating a negative-type photosensitive resin composition on a snbstrate, wherein the composition comprises an epoxy compound, poly(p-vinylphenol) and a phenol-biphenylene resin; exposing the resin composition; and developing of the exposed composition to form the resist pattern.

4. The method of claim 3, wherein the developing comprises contacting the exposed composition with an aqueous alkaline solution.

5. The method of claim 3, wherein the exposing comprises exposing the resin composition to actinic radiation.

6. The negative-type photosensitive resin composition of claim 1, wherein the composition is developable in an aqueous alkaline solution.

7. The negative-type photosensitive resin composition of claim 1, further comprising an alkoxyalkylated melamine.

8. The method of claim 3, wherein the negative-type photosensitive resin composition further comprises an alkoxyalkylated melamine.

9. The method of claim 3, wherein the composition further comprises a photo-acid-generating agent.

10. The negative-type photosensitive resin composition of claim 1, wherein the composition further comprises a photo-acid-generating agent.

* * * * *